US011676923B2

(12) United States Patent
Park et al.

(10) Patent No.: US 11,676,923 B2
(45) Date of Patent: Jun. 13, 2023

(54) SEMICONDUCTOR PACKAGES

(71) Applicant: Samsung Electronics Co., Ltd., Suwon-si (KR)

(72) Inventors: Jinduck Park, Asan-si (KR); Chansik Kwon, Asan-si (KR); Jongkeun Moon, Asan-si (KR); Suyang Lee, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 34 days.

(21) Appl. No.: 16/885,748

(22) Filed: May 28, 2020

(65) Prior Publication Data

US 2021/0104483 A1 Apr. 8, 2021

(30) Foreign Application Priority Data

Oct. 8, 2019 (KR) .................. 10-2019-0124742

(51) Int. Cl.
*H01L 23/00* (2006.01)
*H01L 25/065* (2023.01)
*H01L 23/31* (2006.01)

(52) U.S. Cl.
CPC .......... *H01L 24/13* (2013.01); *H01L 23/3121* (2013.01); *H01L 25/0657* (2013.01); *H01L 2224/16227* (2013.01); *H01L 2225/06513* (2013.01); *H01L 2225/06541* (2013.01)

(58) Field of Classification Search
CPC . H01L 2224/29082; H01L 2224/81024; H01L 2224/83024; H01L 2224/10145; H01L 2224/10126; H01L 2224/13082; H01L 2224/95; H01L 23/3135;
(Continued)

(56) References Cited

U.S. PATENT DOCUMENTS

| 6,555,414 B1 | 4/2003 | Vanfleteren et al. |
| 6,586,843 B2 | 7/2003 | Sterrett et al. |
| 6,696,644 B1 | 2/2004 | Chiu et al. |

(Continued)

FOREIGN PATENT DOCUMENTS

| KR | 1020030091238 | 12/2003 |
| KR | 1020130042939 | 4/2013 |

*Primary Examiner* — Victor A Mandala
*Assistant Examiner* — Lawrence C Tynes, Jr.
(74) *Attorney, Agent, or Firm* — Myers Bigel, P.A.

(57) ABSTRACT

Semiconductor packages may include a first semiconductor chip including a first through-electrode and a first upper connection pad and on an upper surface of the first semiconductor chip, a second semiconductor chip on the first semiconductor chip and including a second lower connection pad on a lower surface of the second semiconductor chip, a connection bump between the first and second semiconductor chips and connected to the first upper connection pad and the second lower connection pad, a first insulating layer between the first and second semiconductor chips and surrounding the first upper connection pad, the connection bump, and the second lower connection pad, and a second insulating layer between the first semiconductor chip and the first insulating layer and extending on the upper surface of the first semiconductor chip, a side surface of the first upper connection pad, and a portion of a side surface of the connection bump.

9 Claims, 18 Drawing Sheets

(58) Field of Classification Search
CPC ............. H01L 25/0657; H01L 25/0652; H01L 2225/06565
See application file for complete search history.

(56) References Cited

U.S. PATENT DOCUMENTS

| | | | |
|---|---|---|---|
| 9,601,465 B2* | 3/2017 | Kang | H01L 21/76898 |
| 2006/0097377 A1 | 5/2006 | Youn | |
| 2009/0029504 A1 | 1/2009 | Paik et al. | |
| 2010/0164079 A1* | 7/2010 | Dekker | H01L 24/16 |
| | | | 257/676 |
| 2013/0087917 A1* | 4/2013 | Jee | H01L 24/05 |
| | | | 257/738 |
| 2013/0099374 A1 | 4/2013 | Han | |
| 2014/0035148 A1* | 2/2014 | Chuang | H01L 24/81 |
| | | | 257/762 |
| 2014/0367867 A1* | 12/2014 | Lin | H01L 23/3128 |
| | | | 257/777 |
| 2015/0102468 A1* | 4/2015 | Kang | H01L 24/92 |
| | | | 257/621 |
| 2015/0171037 A1* | 6/2015 | Wang | H01L 24/13 |
| | | | 438/615 |
| 2017/0246699 A1* | 8/2017 | Song | H01L 24/16 |
| 2018/0204820 A1* | 7/2018 | Zhai | H01L 24/97 |
| 2019/0131241 A1* | 5/2019 | Jeng | H01L 23/5383 |
| 2019/0206841 A1* | 7/2019 | Kim | H01L 25/0657 |

* cited by examiner

SEMICONDUCTOR PACKAGES

CROSS-REFERENCE TO RELATED APPLICATION

This application claims priority under 35 U.S.C. § 119 to Korean Patent Application No. 10-2019-0124742 filed on Oct. 8, 2019 in the Korean Intellectual Property Office, the disclosure of which is incorporated herein by reference in its entirety.

FIELD

The present inventive concept relates to the field of electronics and, more particularly, to a semiconductor package.

BACKGROUND

With the development of the electronics industry and demand from users, electronic devices have been designed to have reduced sizes and weights, and a semiconductor package used in electronic devices has been developed to have high performance and high capacity in accordance with a reduced size and weight. To implement high performance and high capacity along with a reduced size and weight, there has been continuous research and development on semiconductor chips including through silicon vias (TSV) and a semiconductor package including such semiconductor chips stacked therein.

SUMMARY

According to example embodiments of the present inventive concept, semiconductor packages having improved electrical reliability are provided.

According to some example embodiments of the present inventive concept, semiconductor packages may include a first semiconductor chip including a first through-electrode and a first upper connection pad connected to the first through-electrode and on an upper surface of the first semiconductor chip; a second semiconductor chip on the first semiconductor chip and including a second lower connection pad disposed on a lower surface of the second semiconductor chip, the lower surface of the second semiconductor chip may face the upper surface of the first semiconductor chip; a connection bump between the first semiconductor chip and the second semiconductor chip and connected to the first upper connection pad and the second lower connection pad; a first insulating layer between the first semiconductor chip and the second semiconductor chip, the first upper connection pad, the connection bump, and the second lower connection pad may be in the first insulating layer; and a second insulating layer extending between the first semiconductor chip and the first insulating layer and extending on the upper surface of the first semiconductor chip, a side surface of the first upper connection pad, and a portion of a side surface of the connection bump.

According to some example embodiments of the present inventive concept, semiconductor packages may include a first semiconductor chip including a first through-electrode and a first upper connection pad connected to the first through-electrode and on an upper surface of the first semiconductor chip; a second semiconductor chip disposed on the first semiconductor chip and having a second lower connection pad on a lower surface of the second semiconductor chip, the lower surface of the second semiconductor chip may face the upper surface of the first semiconductor chip; a connection bump between the first semiconductor chip and the second semiconductor chip and connected to the first upper connection pad and the second lower connection pad; and an insulating film between the first semiconductor chip and the second semiconductor chip and including a first insulating layer and a second insulating layer including different a material from a material of the first insulating layer, the second insulating layer may extend between the first insulating layer and may be curved to conform to the upper surface of the first semiconductor chip and a side surface of the first upper connection pad.

According to some example embodiments of the present inventive concept, semiconductor packages may include a first semiconductor chip including a first through-electrode and a first upper connection pad connected to the first through-electrode and on an upper surface of the first semiconductor chip; a second semiconductor chip on the first semiconductor chip and including a second lower connection pad on a lower surface of the second semiconductor chip, the lower surface of the second semiconductor chip may face the upper surface of the first semiconductor chip; a connection bump between the first semiconductor chip and the second semiconductor chip and connected to the first upper connection pad and the second lower connection pad; a first insulating film between the first semiconductor chip and the second semiconductor chip, and including a first non-conductive film layer, and a first flux layer between the first non-conductive film layer and the first semiconductor chip, the first upper connection pad, the second lower connection pad, and the connection bump may be in the first non-conductive film layer; and a first molding member on side surfaces of the first semiconductor chip, the second semiconductor chip, and the first insulating film, and the first non-conductive film layer comprises a lower surface facing the first semiconductor chip, the first upper connection pad comprises an upper surface facing the second semiconductor chip, and the lower surface of the first non-conductive film layer is closer to the first semiconductor chip than the upper surface of the first upper connection pad.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, some example embodiments of the present inventive concept will be described with reference to the accompanying drawings.

Figure 1:
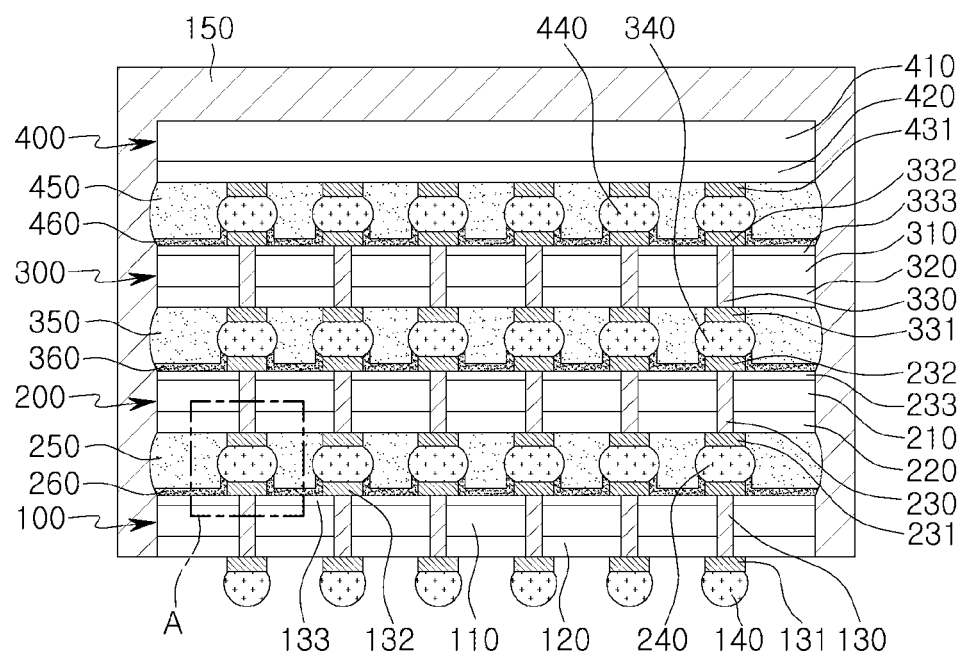
FIG. 1 is a cross-sectional diagram illustrating a semiconductor package according to some example embodiments of the present inventive concept.

FIG. 1 is a cross-sectional diagram illustrating a semiconductor package 1a according to some example embodiments of the inventive concept.

Referring to FIG. 1, the semiconductor package 1a may include a first semiconductor chip 100, a second semiconductor chip 200, a third semiconductor chip 300, and a fourth semiconductor chip 400. The first to fourth semiconductor chips 100, 200, 300, and 400 may be stacked on the first semiconductor chip 100 in order. The first to fourth semiconductor chips 100, 200, 300, and 400 may also be electrically connected to one another through first to fourth connection bumps 140, 240, 340, and 440 or may be electrically connected to a base die or a base substrate (e.g., the element 600 in FIGS. 8 and 9). The first to fourth semiconductor chips 100, 200, 300, and 400 may be attached to one another by first to third insulating films including first insulating layers 250, 350, and 450 and second insulating layers 260, 360, and 460, respectively.

Each of the first to fourth semiconductor chips 100, 200, 300, and 400 may be configured as a logic chip or a memory chip. For example, the first to fourth semiconductor chips 100, 200, 300, and 400 may be the same type of memory chips, or some of the first to fourth semiconductor chips 100, 200, 300, and 400 may be configured as memory chips, and the other may be configured as logic chips.

The memory chip may be, for example, a volatile memory chip such as a dynamic random access memory (DRAM) or a static random access memory (SRAM), or a non-volatile memory chip such as a phase-change random access memory (PRAM), a magnetoresistive random access memory (MRAM), a ferroelectric random access memory (FeRAM), or a resistive random access memory (RRAM). In some example embodiments, the first to fourth semiconductor chips 100, 200, 300, and 400 may be configured as high bandwidth memories (DRAM). Also, the logic chip may be, for example, a microprocessor, an analog device, or a digital signal processor.

FIG. 1 illustrates an example of the semiconductor package 1a including the first to fourth semiconductor chips 100, 200, 300, and 400 stacked therein, but the number of semiconductor chips stacked in the semiconductor package 1a is not limited thereto. For example, the semiconductor package 1a may include two, three, or five or more semiconductor chips therein.

The first semiconductor chip 100 may include a first semiconductor substrate 110, a first semiconductor device layer 120, a first through-electrode 130, a first lower connection pad 131, a first upper connection pad 132, and a first connection bump 140.

The first semiconductor substrate 110 may have an upper surface and a lower surface opposing each other. The upper surface of the first semiconductor substrate 110 may face the second semiconductor chip 200. The first semiconductor substrate 110 may include the first semiconductor device layer 120 disposed below the lower surface of the first semiconductor substrate 110. In some embodiments, the first semiconductor device layer 120 may extend on and may contact the lower surface of the first semiconductor substrate 110 as illustrated in FIG. 1. The first through-electrode 130 may penetrate the first semiconductor substrate 110 and may extend from the upper surface to the lower surface of the first semiconductor substrate 110. In some embodiments, the first through-electrode 130 may extend through the first semiconductor substrate 110 as illustrated in FIG. 1. The first through-electrode 130 may also be connected to a first wiring structure (not illustrated) included in the first semiconductor device layer 120 or may penetrate the first semiconductor device layer 120 and may be directly connected to the first lower connection pad 131. In some embodiments, the first through-electrode 130 may also extend through the first semiconductor device layer 120 as illustrated in FIG. 1. Different from FIG. 1, in some embodiments, the first lower connection pad 131 disposed on the first semiconductor device layer 120 may be electrically connected to the first through-electrode 130 through the first wiring structure (not illustrated) included in the first semiconductor device layer 120. As used herein the term "connected" may mean physically connected and/or electrically connected.

The first semiconductor substrate 110 may include, for example, silicon. In some embodiments, the first semiconductor substrate 110 may include semiconductor elements such as germanium, or a compound semiconductor such as silicon carbide (SiC), gallium arsenide (GaAs), indium arsenide (InAs), or indium phosphide (InP). In some embodiments, the first semiconductor substrate 110 may have a silicon on insulator (SOI) structure. For example, the first semiconductor substrate 110 may include a buried oxide (BOX) layer. The first semiconductor substrate 110 may include a conductive region, such as, for example, a well doped with impurities or a structure doped with impurities. The first semiconductor substrate 110 may also include various types of device separation structures such as a shallow trench isolation (STI).

The first semiconductor device layer 120 may include the first wiring structure (not illustrated) for connecting a plurality of individual devices to other wirings formed on the first semiconductor substrate 110. The first wiring structure may include a metal wiring layer and a via plug.

The first through-electrode 130 may extend from an upper surface of the first semiconductor substrate 110 to a lower surface and may extend into the first semiconductor device layer 120. At least a portion of the first through-electrode 130 may have a pillar shape. "An element having a pillar shape" (or similar language) as used herein refers to an element that includes a bottom surface and a vertical portion extending from the bottom surface in a vertical direction. The vertical portion of the element may or may not have a side perpendicular to the bottom surface. An element having a pillar shape or a pillar structure may be referred to as a vertical structure.

The first lower connection pad 131 may be disposed on the first semiconductor device layer 120 and may be electrically connected to the first wiring structure disposed in the first semiconductor device layer 120 or may be directly connected to the first through-electrode 130. The first lower connection pad 131 may include, for example, at least one of aluminum, copper, nickel, tungsten, platinum, and gold.

Although not illustrated in FIG. 1, a first lower passivation layer for protecting the first wiring structure included in the first semiconductor device layer 120 and the other structures below the first semiconductor device layer 120 from external impacts or moisture may be disposed on the first semiconductor device layer 120. The first lower passivation layer may expose at least a portion of an upper surface of the first lower connection pad 131. The upper surface of the first lower connection pad 131 may face the first semiconductor substrate 110.

The first upper connection pad 132 may be disposed on the upper surface of the first semiconductor substrate 110 and may be electrically connected to the first through-electrode 130. The first upper connection pad 132 may include a material the same as a material of the first lower connection pad 131. Also, a first upper passivation layer 133 (or a first rear side protective layer) covering an upper surface of the first semiconductor substrate 110 and surrounding a portion of a side surface of the first through-electrode 130 may be disposed on the upper surface of the first semiconductor substrate 110. The second insulating layer 260 may extend along an upper surface of the first upper passivation layer 133 and a side surface of the first upper connection pad. The upper surfaces of the first semiconductor substrate 110 and the first upper passivation layer 133 may face the second semiconductor chip 200.

The first connection bump 140 may be disposed on the first lower connection pad 131. The first connection bump 140 may be used to electrically connect the semiconductor package 1a to an external base substrate (e.g., the element 600 in FIG. 8). Through the first connection bump 140, at least one of a control signal, a power signal, or a ground signal for operating the first to fourth semiconductor chips 100, 200, 300, and 400, or a data signal stored in the first to fourth semiconductor chips 100, 200, 300, and 400 may be provided from an external entity, or data stored in the first to fourth semiconductor chips 100, 200, 300, and 400 may be provided to an external entity. For example, the first connection bump 140 may include a pillar structure, a ball structure, or a solder layer. The external entity used herein may refer to a device that is outside of a semiconductor package (e.g., the semiconductor package 1a).

The second semiconductor chip 200 may be mounted on the upper surface of the first semiconductor chip 100. The second semiconductor chip 200 may be electrically connected to the first semiconductor chip 100 through the second connection bump 240 interposed between the upper surface of the first semiconductor chip 100 and a lower surface of the second semiconductor chip 200. The lower surface of the second semiconductor chip 200 may face the first semiconductor chip 100.

First insulating film may be interposed between the lower surface of the second semiconductor chip 200 and the upper surface of the first semiconductor chip 100 such that the second semiconductor chip 200 may be attached to the first semiconductor chip 100. The first insulating film may include different materials and may include the first and second insulating layers 250 and 260 having different thicknesses, respectively, as illustrated in FIG. 1. Also, the first insulating film may protrude from side surfaces of the first semiconductor chip 100 and the second semiconductor chip 200 in a direction of periphery of the first semiconductor chip 100 and the second semiconductor chip 200, and although not illustrated in FIG. 1, a portion of the protruding first insulating film may cover a portion of side surfaces of the first semiconductor chip 100 and the second semiconductor chip 200. The first insulating layer 250 may be disposed between the first semiconductor chip 100 and the second semiconductor chip 200, and may surround the first upper connection pad 132, the second connection bump 240, and the second lower connection pad 231. The second insulating layer 260 may be disposed between the first semiconductor chip 100 and the first insulating layer 250, and may cover the upper surface of the first semiconductor chip 100, a side surface of the first upper connection pad 132, and a portion of a side surface of the second connection bump 240. Accordingly, the first insulating layer 250 may be spaced apart from the first upper connection pad 132 by the second insulating layer 260. In some embodiments, the first insulating film may protrude outwardly beyond the side surfaces of the first semiconductor chip 100 and the second semiconductor chip 200 as illustrated in FIG. 1. In some embodiments, the second insulating layer 260 separates the first upper connection pad 132 from the first insulating layer 250 as illustrated in FIG. 1. "An element A surrounding an element B" (or similar language) as used herein may mean that the element A is at least partially around the element B but does not necessarily mean that the element A completely encloses the element B and may also mean at least a portion of the element B is in the element A.

The first insulating layer 250 may be in (e.g., may fill) a space between the first semiconductor chip 100 and the second semiconductor chip 200, the second insulating layer 260 may be disposed on a lower surface of the first insulating layer 250, and may be curved to conform to the upper surface of the first semiconductor chip 100 and a surface of the first upper connection pad 132. Accordingly, a lower surface of the first insulating layer 250 may be disposed on a level lower than an upper surface of the first upper connection pad 132. The second insulating layer 260 may include a first portion extending in a first direction to conform to the upper surface of the first semiconductor chip 100 and a second portion extending in a second direction to conform to a side surface of the first upper connection pad 132 and in contact with the second connection bump 240. The upper surfaces of the first upper connection pad 132 may face the second semiconductor chip 200. In some embodiments, the second insulating layer 260 may have a uniform thickness along the upper surface of the first semiconductor chip 100 and the side surface of the first upper connection pad 132 as illustrated in FIG. 1. The second insulating layer 260 may include a first portion extending on the upper surface of the first semiconductor chip 100 and a second portion extending on the side surface of the first upper connection pad 132, and the first and second portions of the second insulating layer 260 may have an equal thickness as illustrated in FIG. 1. "An element A filling an element B" (or similar language) as used herein means that the element A is in the element B but does not necessarily mean that the element A fills the element B entirely.

The third semiconductor chip 300 may be mounted on an upper surface of the second semiconductor chip 200, and the third semiconductor chip 300 may be electrically connected to the second semiconductor chip 200 through the third connection bump 340 disposed between the upper surface of the second semiconductor chip 200 and a lower surface of the third semiconductor chip 300. Also, second insulating film may be interposed between the lower surface of the third semiconductor chip 300 and the upper surface of the second semiconductor chip 200. The upper surface of the second semiconductor chip 200 may face the lower surface of the third semiconductor chip 300.

The fourth semiconductor chip 400 may be mounted on the upper surface of the third semiconductor chip 300, and the fourth semiconductor chip 400 may be electrically connected to the third semiconductor chip 300 through the fourth connection bump 440 interposed between the upper surface of the third semiconductor chip 300 and a lower surface of the fourth semiconductor chip 400. Also, third insulating film may be interposed between the lower surface of the fourth semiconductor chip 400 and the upper surface of the third semiconductor chip 300.

The second semiconductor chip 200 may include a second semiconductor substrate 210, a second semiconductor device layer 220, a second through-electrode 230, a second lower connection pad 231, a second upper connection pad 232, a second upper passivation layer 233, and a second connection bump 240.

The third semiconductor chip 300 may include a third semiconductor substrate 310, a third semiconductor device layer 320, a third through-electrode 330, a third lower connection pad 331, a third upper connection pad 332, a third upper passivation layer 333, and a third connection bump 340.

The fourth semiconductor chip 400 may include a fourth semiconductor substrate 410, a fourth semiconductor device layer 420, a fourth lower connection pad 431, and a fourth connection bump 440. The fourth semiconductor chip 400 may not include a through-electrode, differently from the first to third semiconductor chips 100, 200, and 300.

The second to fourth semiconductor chips 200, 300, and 400 may be the same as or similar to the first semiconductor chip 100. Thus, detailed descriptions of the second to fourth semiconductor chips 200, 300, and 400 may not be provided.

The semiconductor package 1a may further include a molding member 150 surrounding side surfaces of the first to fourth semiconductor chips 100, 200, 300, and 400 and side surfaces of the first to third insulating films. In some example embodiments, the molding member 150 may cover an upper surface of the fourth semiconductor chip 400 as illustrated in FIG. 1, but the present inventive concept is not limited thereto. Differently from the example illustrated in FIG. 1, the molding member 150 may not cover and may expose the upper surface of the fourth semiconductor chip 400. The molding member 150 may include, for example, an epoxy mold compound (EMC), or the like. A lower surface of the fourth semiconductor chip 400 may face the third semiconductor chip 300 and may be opposite to the upper surface of the fourth semiconductor chip 400. "An element A covering a surface of an element B" (or similar language) as used herein means that the element A is on the surface of the element B but does not necessarily mean that the element A covers the surface of the element B entirely.

Figure 2:
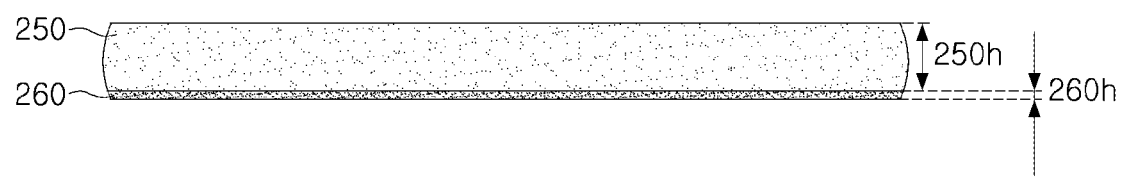
FIG. 2 is a cross-sectional diagram illustrating an insulating film illustrated in FIG. 1.

FIG. 2 is a cross-sectional diagram illustrating the insulating film illustrated in FIG. 1. FIG. 2 only illustrates the first insulating film among the elements illustrated in FIG. 1, and the first upper connection pad 132, the second connection bump 240, and the second lower connection pad 231 surrounded by the first insulating film are not illustrated in FIG. 2. Accordingly, heights 250h and 260h of the first insulating film illustrated in FIG. 2 are heights thereof in a cured state after a process of manufacturing the semiconductor package 1a is completed.

Referring to FIG. 2, the first insulating film illustrated in FIG. 1 may include a first insulating layer 250 and a second insulating layer 260 disposed on a lower surface of the first insulating layer 250. The second and third insulating films described above may also include first insulating layers 350 and 450 and second insulating layers 360 and 460, respectively, similarly to the first insulating film.

The first insulating layer 250 may be configured as a non-conductive film, and may include, for example, an adhesive resin. The adhesive resin may attach the first insulating layer 250 to the second insulating layer 260, and may attach the first insulating layer 250 and the second insulating layer 260 to the first semiconductor chip 100 and the second semiconductor chip 200. The adhesive resin may be implemented by a thermosetting resin. For example, the adhesive resin may include a bisphenol epoxy resin, a novolak epoxy resin, a phenol resin, a urea resin, a melamine resin, an unsaturated polyester resin, and a resorcinol resin. Also, the first insulating layer 250 may further include a flux in the non-conductive film (NCF) in addition to the adhesive resin.

The second insulating layer 260 may be configured as a flux. The flux may be used for the soldering for electrical contact between semiconductor chips in a process of manufacturing a semiconductor package. The flux may improve dispersibility and wetness of a solder, and may be coated in advance on a region on which a solder will be contacted, or may be directly coated on a region of a solder exposed from NCF (see region "S" in FIG. 16). Generally, a flux may be classified into a resin flux, an organic flux, and an inorganic flux, and a resin flux is generally used in an electronic device. As a main material of the resin flux, a rosin, a modified rosin, a synthetic resin, or the like, may be used. The flux may be classified into a rosin activated (RA) flux, a rosin mildly activated (RMA), and a rosin (R) flux.

A thickness 250h of the first insulating layer 250 may be greater than a thickness 260h of the second insulating layer 260. For example, when the thickness 250h of the first insulating layer 250 is within 11 to 17 μm approximately, the thickness 260h of the second insulating layer 260 may be 1 to 3 μm approximately. However, the inventive concept is not limited thereto, and the thickness 250h of the first insulating layer 250 and the thickness 260h of the second insulating layer 260 may be varied depending on types of semiconductor chips attached using a non-conductive film (NCF). The thicknesses 250h and 260h of the first insulating layer 250 and the second insulating layer 260, respectively, cured through a reflow process in the process of manufacturing the semiconductor package, may be smaller than initial thicknesses, and each of both ends of the first insulating layer 250 and the second insulating layer 260 may thus have an externally protruding shape.

In a semiconductor package in which a plurality of semiconductor chips including through-electrodes are stacked to reduce a size of an electronic device and to improve performance of an electronic device, a non-conductive film NCF may be used as an adhesive material for adhering semiconductor chips to each other so as to uniformly attach the semiconductor chips, to attach a fine-sized connection bump, and to improve wetness of a solder, electrical reliability, structural reliability, and the like, in a process of stacking the semiconductor chips.

However, when pressure is insufficient or the non-conductive film is cured early in a reflow process or a thermal compression process performed to attach semiconductor chips, a contact defect of a solder, such as a non-wet solder, may occur. When pressure is excessive, a defect of shorts may occur between adjacent solders.

As the semiconductor package includes the insulating film including the first insulating layer 250 and the second insulating layer 260 having different thicknesses, wetness of a solder, electrical reliability, and other properties, may improve.

Figure 3:
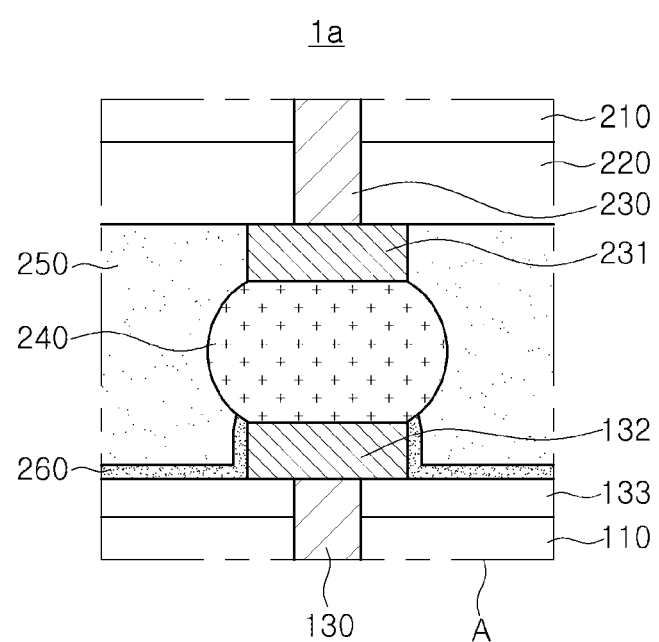
FIG. 3 is an enlarged diagram illustrating a region "A" illustrated in FIG. 1.

FIG. 3 is an enlarged diagram illustrating a region "A" illustrated in FIG. 1.

Referring to FIG. 3, in the semiconductor package 1a, a first insulating layer 250 may be in contact with a lower surface of a second semiconductor device layer 220 (i.e., a lower surface of the second semiconductor chip 200), and the second insulating layer 260 may be in contact with an upper surface of a first upper passivation layer 133 (i.e., the upper surface of the first semiconductor chip 100).

For example, the semiconductor package 1a may include a first upper connection pad 132 disposed on an upper surface of the first semiconductor chip 100 (in FIG. 1) and connected to a first through-electrode 130, a second lower connection pad 231 disposed on a lower surface of a second semiconductor chip 200 (in FIG. 1) and connected to a second through-electrode 230, and a second connection bump 240 electrically connecting the first upper connection pad 132 to the second lower connection pad 231. The first insulating layer 250 may be in contact with a side surface of the second lower connection pad 231 and a portion of a side surface of the second connection bump 240, and the second insulating layer 260 may be in contact with a side surface of the first upper connection pad 132 and the other portion of the side surface of the second connection bump 240, other than the above-described portion of the side surface of the second connection bump 240. An area of the portion of the side surface of the second connection bump 240 in contact with the first insulating layer 250 may be greater than an area of the other portion of the side surface of the second connection bump 240 in contact with the second insulating layer 260. In some embodiments, in a cross-sectional view, the portion of the side surface of the second connection bump 240 contacting the first insulating layer 250 may have a length longer than a length of the other portion of the side surface of the second connection bump 240 contacting the second insulating layer 260 as illustrated in FIG. 3.

The second insulating layer 260 may be configured as a flux. The second insulating layer 260 may be interposed between the second connection bump 240 and the first upper connection pad 132 before a reflow process, and may inhibit or possibly prevent the first insulating layer 250 from flowing into a region between a lower region of the second connection bump 240 and the first upper connection pad 132. In other words, the second insulating layer 260 may induce a preferential contact between the second connection bump 240 and the first upper connection pad 132 during a reflow process such that contact reliability between the second connection bump 240 and the first upper connection pad 132 may be improved or secured.

Figure 4:
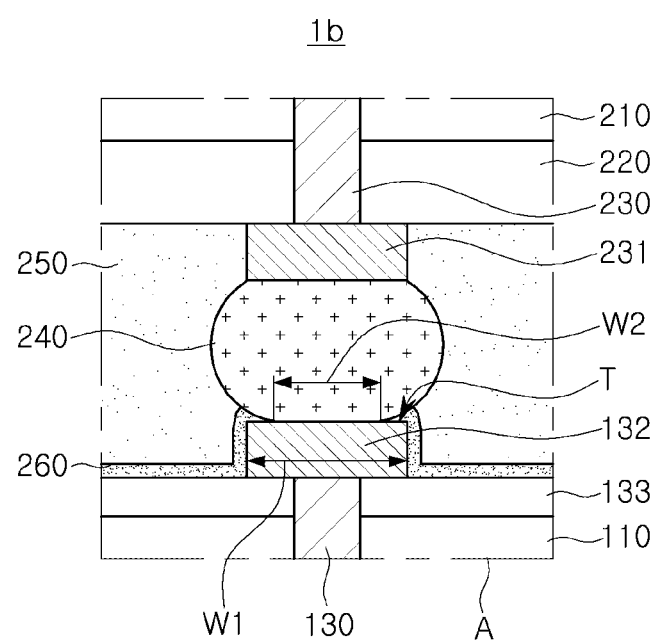
FIG. 4 is an enlarged diagram illustrating a partial region of a semiconductor package according to some example embodiments of the present inventive concept.

FIG. 4 is an enlarged diagram illustrating a partial region of a semiconductor package 1b, corresponding to the portion illustrated in FIG. 3, according to some example embodiments of the inventive concept. The elements having the same reference numeral in FIGS. 3 and 4 are the same or similar elements. The elements included in the semiconductor package 1b in FIG. 4 may be similar to the elements included in the semiconductor package 1a illustrated in FIG. 1, other than the structure illustrated in FIG. 4.

Referring to FIG. 4, a width W1 of an upper surface T of a first upper connection pad 132 in the semiconductor package 1b may be greater than a width W2 of a contact surface between the first upper connection pad 132 and a second connection bump 240, and the second insulating layer 260 may cover a portion of the upper surface T of the first upper connection pad 132 other than the contact surface between the first upper connection pad 132 and a second connection bump 240. In some embodiments, the upper surface T of the first upper connection pad 132 may include a first portion contacting the second connection bump 240 and a second portion not contacting the second connection bump 240, and the second insulating layer 260 may contact the second portion of the upper surface T of the first upper connection pad 132 as illustrated in FIG. 4.

For example, the semiconductor package 1b may include the first upper connection pad 132 disposed on an upper surface of a first semiconductor chip 100 (in FIG. 1) and connected to a first through-electrode 130, a second lower connection pad 231 disposed on a lower surface of a second semiconductor chip 200 (in FIG. 200) and connected to a second through-electrode 230, and a second connection bump 240 electrically connecting the first upper connection pad 132 to the second lower connection pad 231. The first insulating layer 250 may cover a portion of each of a side surface of the second lower connection pad 231 and of a side surface of the second connection bump 240, the width W1 of the upper surface of the first upper connection pad 132 may be greater than the width W2 of the contact surface between the first upper connection pad 132 and the second connection bump 240, and the second insulating layer 260 may cover a portion of the upper surface T of the first upper connection pad 132 other than the side surface of the first upper connection pad 132 and the contact surface between the first upper connection pad 132 and a second connection bump 240.

The second insulating layer 260 may be configured as a flux. The second insulating layer 260 may be interposed between the second connection bump 240 and the first upper connection pad 132 and may inhibit or possibly prevent the first insulating layer 250 from flowing into a region between a lower region of the second connection bump 240 and the first upper connection pad 132. Even when pressure is insufficient in a reflow process, by inducing a preferential contact between the second connection bump 240 and the first upper connection pad 132, a contact surface between the second connection bump 240 and the first upper connection pad 132 may be sufficiently secured. The other elements in FIG. 4 may be substantially the same as or similar to corresponding elements illustrated in FIG. 1, and thus, detailed descriptions thereof will not be provided.

Figure 5:
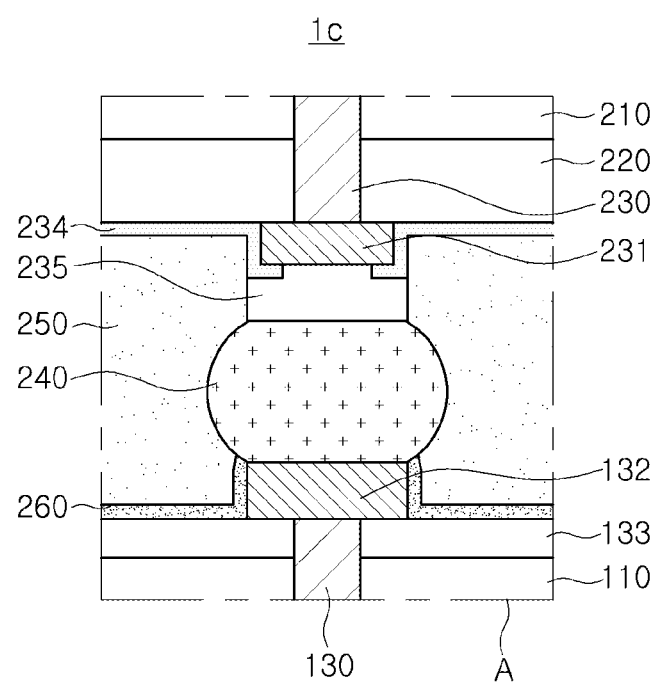
FIG. 5 is an enlarged diagram illustrating a partial region of a semiconductor package according to some example embodiments of the present inventive concept.

FIG. 5 is an enlarged diagram illustrating a partial region of a semiconductor package 1c, corresponding to the portion illustrated in FIG. 3, according to some example embodiments of the inventive concept. The elements having the same reference numeral in FIGS. 3 and 5 are the same or similar elements. Other than the structure illustrated in FIG. 5, the elements included in the semiconductor package 1c in FIG. 5 may be similar to the elements included in the semiconductor package 1a illustrated in FIG. 1.

Referring to FIG. 5, the semiconductor package 1c may further include a second lower passivation layer 234 disposed on a lower surface of a second semiconductor device layer 220 (i.e., a lower surface of a second semiconductor chip 200) and covering a portion of a second lower connection pad 231, and a pillar structure 235 disposed on the second lower connection pad 231 and connecting the second lower connection pad 231 to a second connection bump 240. The second connection bump 240 may be configured as a solder layer.

For example, the semiconductor package 1c may include the first upper connection pad 132 disposed on the upper surface of the first semiconductor chip 100 (in FIG. 1) and connected to a first through-electrode 130, the second lower connection pad 231 disposed on the lower surface of the second semiconductor chip 200 (in FIG. 1) and connected to a second through-electrode 230, and the second connection bump 240 electrically connecting the first upper connection pad 132 to the second lower connection pad 231. The semiconductor package 1c may further include the second lower passivation layer 234 disposed on the lower surface of the second semiconductor chip 200 and covering a portion of the second lower connection pad 231, and the pillar structure 235 disposed on the second lower connection pad 231 and connecting the second lower connection pad 231 to the second connection bump 240. The first insulating layer 250 may cover a surface of the second lower passivation layer 234, a side surface of the pillar structure 235, and a portion of a side surface of the second connection bump 240, and the second insulating layer 260 may cover a side surface of the first upper connection pad 132 and the other portion of the side surface of the second connection bump 240. The other elements in FIG. 5 may be substantially the same as or similar to corresponding elements illustrated in FIG. 1, and thus, detailed descriptions thereof will not be provided.

Figure 6:
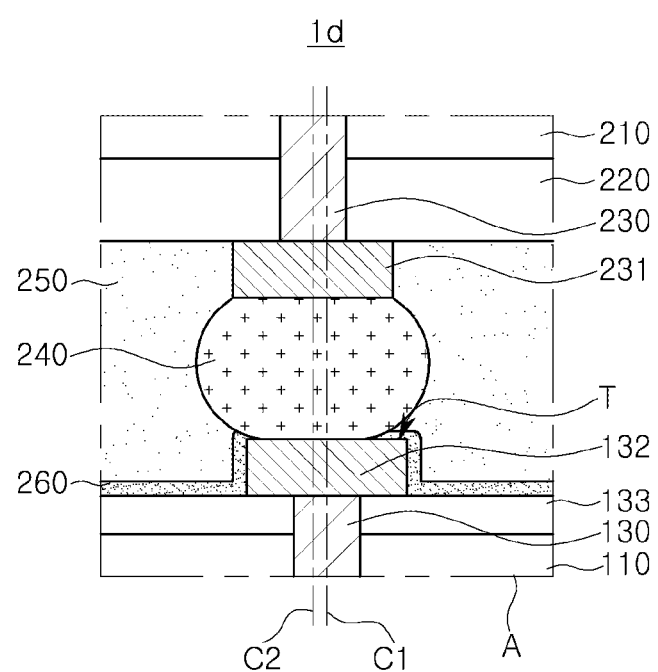
FIG. 6 is an enlarged diagram illustrating a partial region of a semiconductor package according to some example embodiments of the present inventive concept.

FIG. 6 is an enlarged diagram illustrating a partial region of a semiconductor package 1d, corresponding to the portion illustrated in FIG. 3, according to some example embodiments of the inventive concept. The elements having the same reference numeral in FIGS. 3 and 6 are the same or similar elements. Other than the structure illustrated in FIG. 6, the elements included in the semiconductor package 1c in FIG. 6 may be similar to the elements included in the semiconductor package 1a illustrated in FIG. 1.

Referring to FIG. 6, in the semiconductor package 1d, a vertical axis C1 crossing a center of a first upper connection pad 132 (e.g., a center of a first upper connection pad 132 in a horizontal direction) may not match a vertical axis C2 crossing a center of a second lower connection pad 231 (e.g., a center of a second lower connection pad 231 in a horizontal direction). In some embodiments, the vertical axis C1 may be offset from the vertical axis C2 as illustrated in FIG. 6.

For example, the semiconductor package 1d may include a first upper connection pad 132 disposed on an upper surface of a first semiconductor chip 100 (in FIG. 1) and connected to a first through-electrode 130, a second lower connection pad 231 disposed on a lower surface of a second semiconductor chip 200 (in FIG. 1) and connected to a second through-electrode 230, and a second connection bump 240 electrically connecting the first upper connection pad 132 to the second lower connection pad 231. The first insulating layer 250 may cover a side surface of the second lower connection pad 231 and a portion of a side surface of the second connection bump 240. The vertical axis C1 crossing a center of the first upper connection pad 132 may not match the vertical axis C2 crossing a center of the second lower connection pad 231. A second insulating layer 260 may cover an upper surface T of the first upper connection pad 132 other than the side surface of the first upper connection pad 132 and a contact surface between the first upper connection pad 132 and the second connection bump 240. In some embodiments, the upper surface T of the first upper connection pad 132 may include a first portion contacting the second connection bump 240 and a second portion not contacting the second connection bump 240, and the second insulating layer 260 may contact the second portion of the upper surface T of the first upper connection pad 132 as illustrated in FIG. 6.

The second insulating layer 260 may be configured as a flux. The second insulating layer 260 may be interposed between the second connection bump 240 and the first upper connection pad 132 before a reflow process, and may inhibit or possibly prevent the first insulating layer 250 from flowing into a region between a lower region of the second connection bump 240 and the first upper connection pad 132. Even when an alignment of the semiconductor chips is disrupted during a process of stacking the semiconductor chips, by inducing a preferential contact between the second connection bump 240 and the first upper connection pad 132, a contact surface between the second connection bump 240 and the first upper connection pad 132 may be sufficiently secured. The other elements in FIG. 6 may be substantially the same as or similar to corresponding elements illustrated in FIG. 1, and thus, detailed descriptions thereof will not be provided.

Figure 7:
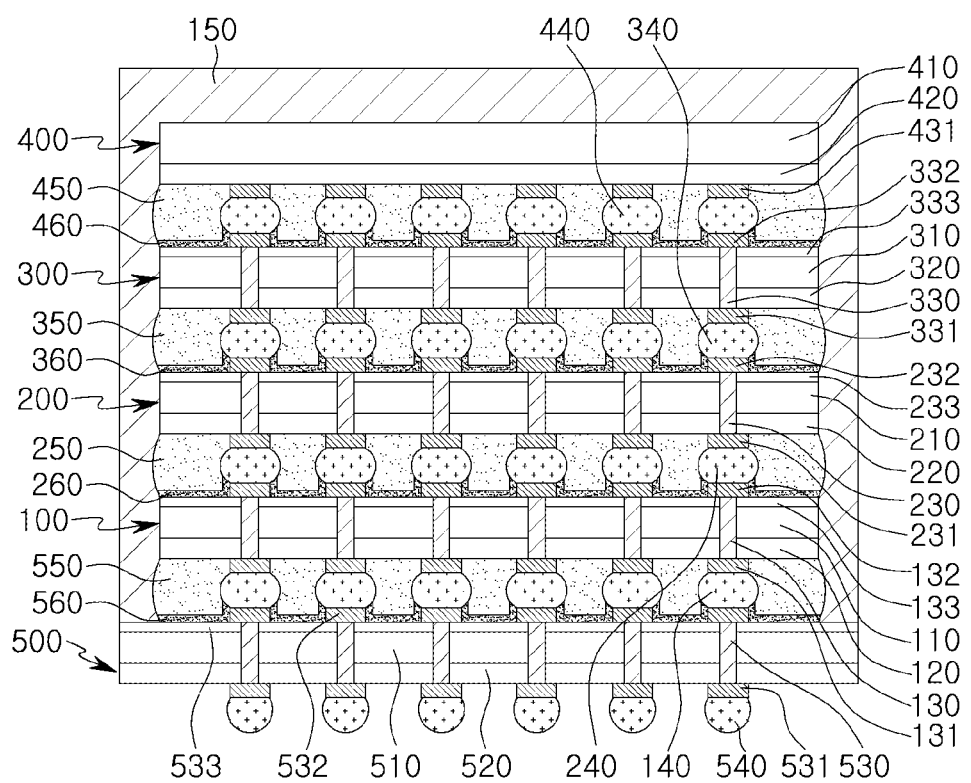
FIG. 7 is a cross-sectional diagram illustrating a semiconductor package according to some example embodiments of the present inventive concept.

FIG. 7 is a cross-sectional diagram illustrating a semiconductor package according to some example embodiments of the inventive concept.

Referring to FIG. 7, a semiconductor package 2a may include a base die 500. The base die 500 may include a base substrate 510, an interlayer insulating film 520, a base through-electrode 530, a base connection pad 531, a base upper connection pad 532, and a lower surface protective layer 533. The base through-electrode 530 may penetrate from an upper surface of the base substrate 510 to a lower surface thereof and may extend into the interlayer insulating film 520. In some embodiments, the base through-electrode 530 may extend through both the base substrate 510 and the interlayer insulating film 520. A plurality of wiring structures (not illustrated) may be formed in the interlayer insulating film 520, and the plurality of wiring structures may be electrically connected to the base through-electrode 530.

A fifth connection bump 540 may be mounted on a lower surface of the base die 500. The fifth connection bump 540 may be disposed on the base connection pad 531 disposed on a lower surface of the base die 500. The fifth connection bump 540 may be similar to the first connection bump 140 illustrated in FIG. 1. The base die 500 may include an upper surface facing the first semiconductor chip and the lower surface opposite to the upper surface of the base die 500.

First to fourth semiconductor chips 100, 200, 300, and 400 may be stacked on the base die 500 in an upward direction. In some embodiments, the first to fourth semiconductor chips 100, 200, 300, and 400 may be sequentially stacked on the base die 500 as illustrated in FIG. 7. A first connection bump 140 may be interposed between the base upper connection pad 532 on an upper surface of the base die 500 and a first lower connection pad 131 on a lower surface of the first semiconductor chip 100. The first connection bump 140 may be similar to the second to fourth connection bumps 240, 340, and 440. The upper surface of the base substrate 510 may face the first semiconductor chip 100.

Fourth insulating film may be interposed between the base die 500 and the first semiconductor chip 100, and the fourth insulating film may include a first insulating layer 550 and a second insulating layer 560. Side surfaces of the fourth insulating film may be covered by a first molding member 150. The fourth insulating film may be similar to the first to third insulating films described above.

The base die 500 may be configured as a dummy semiconductor chip which does not include individual devices included in the first to fourth semiconductor chips 100, 200, 300, and 400. The base die 500 may be configured as a buffer die which may be provided with at least one of a control signal, a power signal, or a ground signal for operating the first to fourth semiconductor chips 100, 200, 300, and 400, or a data signal stored in the first to fourth semiconductor chips 100, 200, 300, and 400 from an external entity, or may provide data stored in the first to fourth semiconductor chips 100, 200, 300, and 400 to an external entity, through the base through-electrode 530 and the base substrate 510.

The first to fourth semiconductor chips 100, 200, 300, and 400 may be stacked on the base die 500 including the base through-electrode 530 having a structure the same as or similar to those of the first to fourth semiconductor chips 100, 200, 300, and 400. Accordingly, the connection bumps 140, 240, 340, and 440 of the first to fourth semiconductor chips 100, 200, 300, and 400 may be surrounded by the first molding member 150 and may not be exposed from the semiconductor package 2a. Accordingly, damages occurring in the process of moving or storing the semiconductor package 2a may be reduced or possibly prevented. In some embodiments, the connection bumps 140, 240, 340, and 440 of the first to fourth semiconductor chips 100, 200, 300, and 400 may not be exposed to an exterior of the semiconductor package 2a.

For example, the semiconductor package 2a illustrated in FIG. 7 may include the base die 500 (also may be referred to as "substrate"), the plurality of semiconductor chips 100, 200, 300, and 400 mounted on the base die 500 and stacked in one direction (e.g., a vertical direction), a first insulating film disposed among the plurality of semiconductor chips 100, 200, 300, and 400, and a second insulating film disposed between the lowermost semiconductor chip 100 of the plurality of semiconductor chips 100, 200, 300, and 400 and the base die 500. A horizontal width of the base die 500 may be greater than a horizontal width of each of the first to fourth semiconductor chips 100, 200, 300, and 400, and the first molding member 150 may cover side surfaces of the plurality of semiconductor chips 100, 200, 300, and 400, side surfaces of the first and second insulating films, and an upper surface of the base die 500. The elements in FIG. 7 having the same reference numerals as in FIG. 1 are the same as or similar to corresponding elements illustrated in FIG. 1, and thus, descriptions thereof will not be provided.

Figure 8:
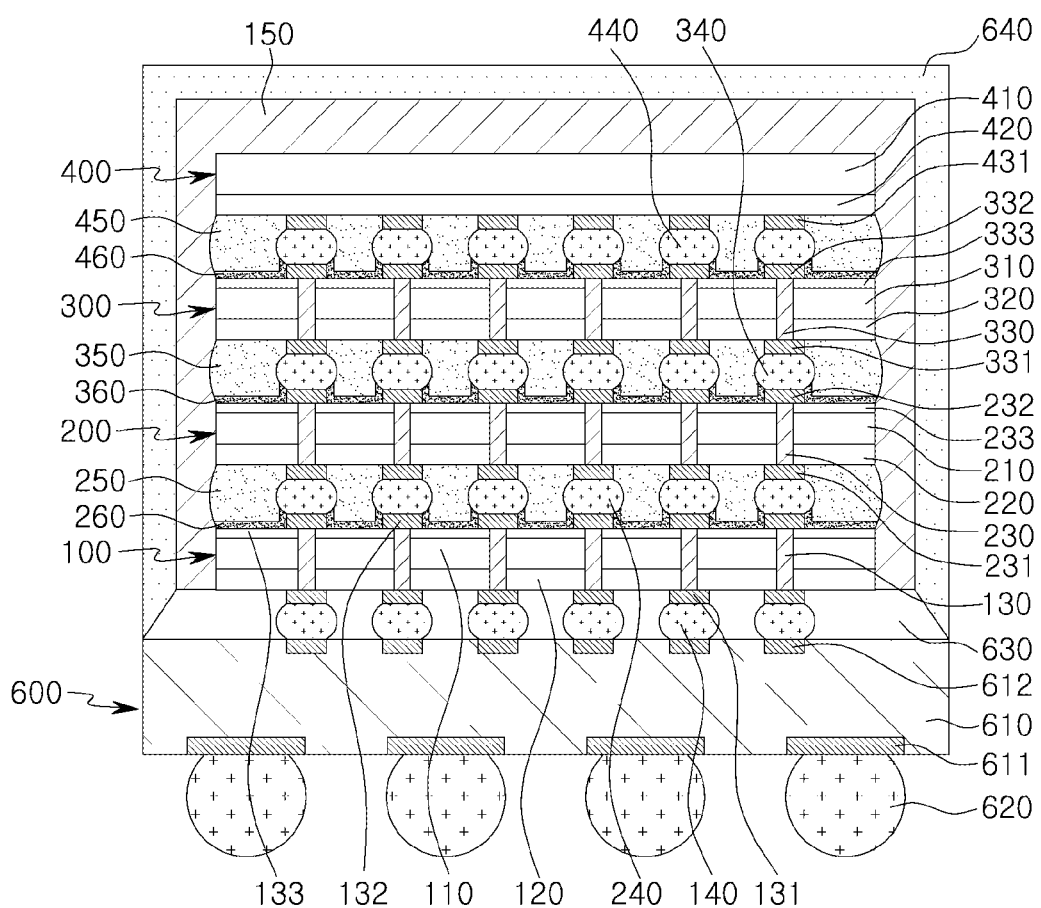
FIG. 8 is a cross-sectional diagram illustrating a semiconductor package according to some example embodiments of the present inventive concept.

FIG. 8 is a cross-sectional diagram illustrating a semiconductor package 2b according to some example embodiments of the inventive concept.

Referring to FIG. 8, a semiconductor package 2b may include a base substrate 600, and first to fourth semiconductor chips 100, 200, 300, and 400 mounted on the base substrate 600, stacked in order on an upper surface of the base substrate 600. The upper surface of the base substrate 600 may face the first semiconductor chip 100.

The base substrate 600 may be implemented by, for example, a printed circuit board, a ceramic substrate, or an interposer. When the base substrate 600 is implemented by a printed circuit board, the base substrate 600 may include a substrate body 610, a lower surface pad 611, an upper surface pad 612, and a solder resist layer (not illustrated) disposed on a lower surface and an upper surface of the substrate body 610. An internal wiring (not illustrated) electrically connecting the lower surface pad 611 to the upper surface pad 612 may be disposed in the substrate body 610. The lower surface pad 611 and the upper surface pad 612 may be a portion of a circuit wiring patterned after coating a lower surface and an upper surface of the substrate body 610 with a copper foil, the portion exposed by the solder resist layer formed on the lower surface and the upper surface of the substrate body 610.

When the base substrate 600 is configured as an interposer, the base substrate 600 may include the substrate body 610 formed of a semiconductor material, and the lower surface pad 611 and the upper surface pad 612 formed on the lower surface and the upper surface of the substrate body 610, respectively. The substrate body 610 may be formed using a silicon wafer, for example. Also, an internal wiring (not illustrated) may be formed on the lower surface and the upper surface of the substrate body 610 or in the substrate body 610. A through via (not illustrated) electrically connecting the lower surface pad 611 to the upper surface pad 612 may be formed in the substrate body 610.

An external connection terminal 620 may be attached to a lower surface of the base substrate 600. The external connection terminal 620 may be attached to, for example, the lower surface pad 611. The external connection terminal 620 may be, for example, a solder ball or a bump. The external connection terminal 620 may electrically connect the semiconductor package 2b to an external device. At least a portion of the external connection terminals 620 may be disposed in a fan-out region vertically, a region in which the external connection terminals 620 do not overlap the first to fourth semiconductor chips 100, 200, 300, and 400 in a vertical direction. In some embodiments, the first to fourth semiconductor chips 100, 200, 300, and 400 may be stacked in the vertical direction as illustrated in FIG. 8. "An element A not overlapping an element B in a vertical direction" (or similar language) as used herein means that no vertical line intersecting both the elements A and B exists.

A first molding member 150 covering at least side surfaces of the first to fourth semiconductor chips 100, 200, 300, and 400, and a second molding member 640 surrounding at least a side surface of the first molding member 150 and not in directly contact with the side surfaces of the first to fourth semiconductor chips 100, 200, 300, and 400 may be disposed on the base substrate 600. The first and second molding members 150 and 650 may be formed of, for example, an epoxy mold compound.

An underfill material layer 630 may be disposed between the base substrate 600 and the first semiconductor chip 100. The underfill material layer 630 may be interposed between the base substrate 600 and the first semiconductor chip 100 and may surround a side surface of the first connection bump 140. The underfill material layer 630 may be formed of, for example, an epoxy resin. The underfill material layer 630 may be a portion of the second molding member 640 formed by, for example, a molded underfill (MUF) method.

Differently from the example illustrated in FIG. 8, an insulating film including a non-conductive film (NCF) and a flux may be disposed between the base substrate 600 and the first semiconductor chip 100, rather than the underfill material layer 630. The other elements in FIG. 8 are substantially the same as or similar to corresponding elements illustrated in FIG. 1, and thus, detailed descriptions thereof will not be provided.

Figure 9:
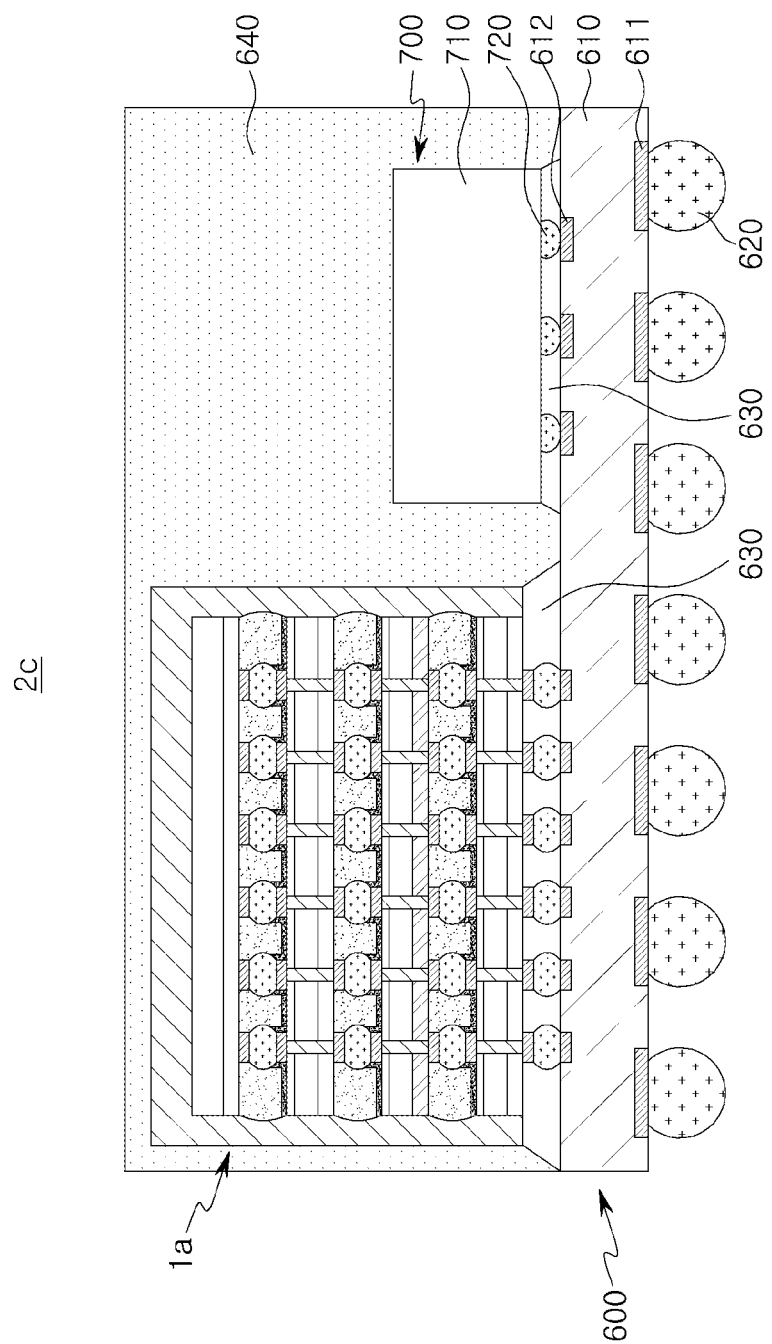
FIG. 9 is a cross-sectional diagram illustrating a semiconductor package according to some example embodiments of the present inventive concept.

FIG. 9 is a cross-sectional diagram illustrating a semiconductor package 2c according to some example embodiments of the inventive concept.

Referring to FIG. 9, the semiconductor package 2c may include a main semiconductor chip 700 attached to a base substrate 600, and first to fourth semiconductor chips 100, 200, 300, and 400 stacked in order on the base substrate 600.

The main semiconductor chip 700 may be configured as a processor unit. The main semiconductor chip 700 may be, for example, a microprocessor unit (MPU) or a graphics processor unit (GPU). The main semiconductor chip 700 may be, for example, a known good package (KGP), a normal operation of which is verified. A main connection terminal 720 may be attached to a lower surface of a body 710 of the main semiconductor chip 700.

An underfill material layer 630 may be disposed in a space between the base substrate 600 and the first semiconductor chip 100 and in a space between the base substrate 600 and the main semiconductor chip 700.

Differently from the example illustrated in FIG. 9, an insulating film formed of a non-conductive film (NCF) and a flux may be disposed between the base substrate 600 and the first semiconductor chip 100, rather than the underfill material layer 630. Also, an insulating film including a non-conductive film (NCF) and a flux may be disposed between the base substrate 600 and the main semiconductor chip 700, rather than the underfill material layer 630.

The second molding member 640 may cover an upper surface of the base substrate 600, a side surface and an upper surface of the main semiconductor chip 700, and at least a side surface of a first molding member (e.g., 150 in FIG. 8) surrounding the first to fourth semiconductor chips 100, 200, 300, and 400.

FIGS. 10 to 18 are cross-sectional diagrams illustrating a method of manufacturing a semiconductor package according to some example embodiments of the inventive concept.

Figure 10:
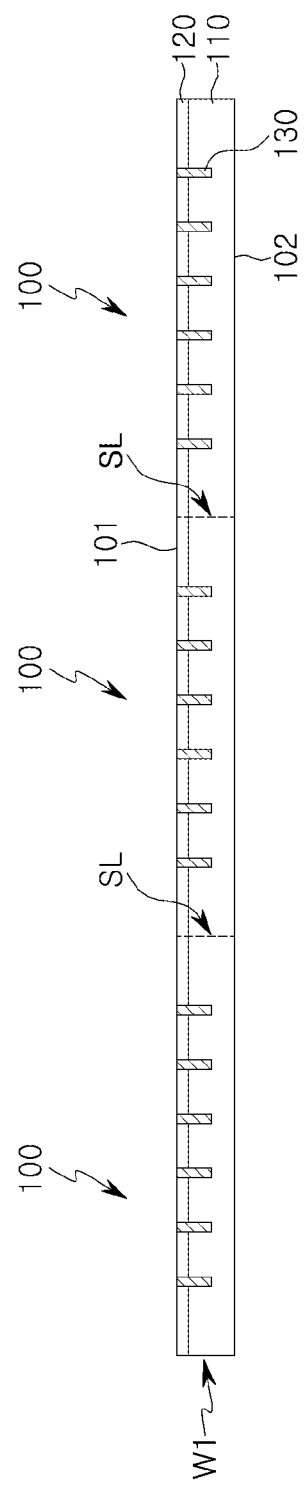
FIGS. 10 to 18 are cross-sectional diagrams illustrating a method of manufacturing a semiconductor package according to some example embodiments of the present inventive concept.

Referring to FIG. 10, a first semiconductor wafer W1 may be prepared. The first semiconductor wafer W1 may include a plurality of semiconductor chips 100 separated from each other by a first scribe lane SL1. The first semiconductor chip 100 may include a first semiconductor substrate 110, a first semiconductor device layer 120, and a first through-electrode 130. The first semiconductor substrate 110 may have a first lower surface 101 and a first upper surface 102 opposing each other. The first semiconductor device layer 120 may be disposed on the first lower surface 101 of the first semiconductor substrate 110. The first through-electrode 130 may penetrate the first semiconductor device layer 120 from the first lower surface 101 of the first semiconductor substrate 110 and may extend into the first semiconductor substrate 110. The first through-electrode 130 may extend through the first semiconductor device layer 120.

The first semiconductor device layer 120 may include a system LSI, a flash memory, a DRAM, an SRAM, an EEPROM, a PRAM, an MRAM, or a RRAM, and may include a plurality of wiring structures for connecting a plurality of individual devices to the other wirings formed on the first semiconductor substrate 110.

The first through-electrode 130 may extend from the first lower surface 101 of the first semiconductor substrate 110 into the first semiconductor substrate 110. At least a portion of the first through-electrode 130 may have a pillar shape. The first through-electrode 130 may include a barrier film formed on a surface of the portion of the first through-electrode 130 having the pillar shape, and a filling conductive layer filling an internal region of the barrier film. A via insulating film may be interposed between the first semiconductor substrate 110 and the first through-electrode 130. The via insulating film may include an oxide film, a nitride film, a carbide film, polymer, or combinations thereof. In some embodiments, the barrier film may define a space therein, and the filling conductive layer may be formed in the space.

In a subsequent process, a portion of the first semiconductor substrate 110 may be removed, and the first through-electrode 130 may be formed of conductive materials penetrating the partially removed first semiconductor substrate 110. For example, the first through-electrode 130 may include the barrier film and a filling conductive layer filling an internal region of the barrier film. In some embodiments, the first through-electrode 130 may include the barrier film, a filing conductive layer filling the internal region of the barrier film, and a portion of the metal wiring layer and/or a via plug.

Figure 11:
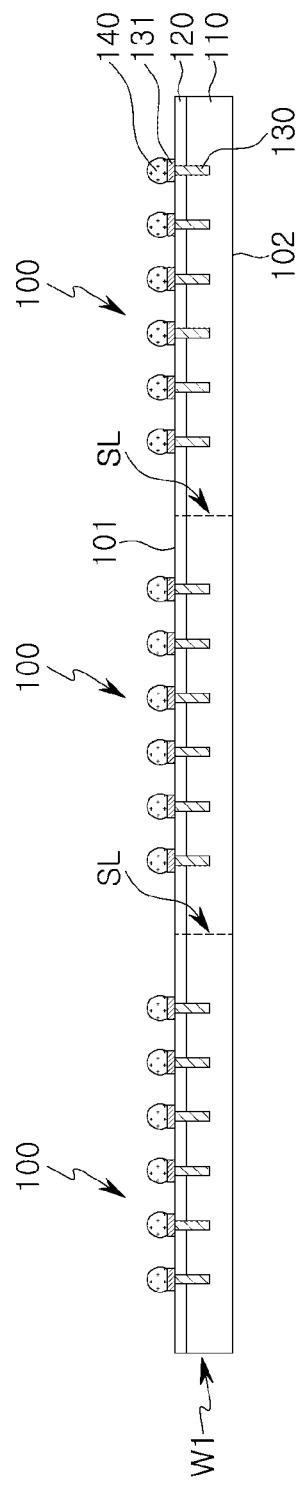

Referring to FIG. 11, a first lower connection pad 131 electrically connected to the first through-electrode 130 may be disposed on the first semiconductor substrate 110, and a first connection bump 140 may be disposed on the first lower connection pad 131. In some example embodiments, the first lower connection pad 131 may not be provided and may be omitted.

The first connection bump 140 may be configured as a solder layer. To form the first connection bump 140, a mask pattern (not illustrated) having an opening (not illustrated) for exposing a portion of the first lower connection pad 131 may be formed on the first semiconductor device layer 120. The first connection bump 140 may be disposed on a portion of the first lower connection pad 131 exposed by the mask pattern. The first connection bump 140 may be formed by, for example, an electrical plating process. The mask pattern (not illustrated) may be removed, and the first connection bump 140 may be reflowed through, for example, a heat treatment such that the first connection bump 140 may have a rounded shape.

Figure 12:
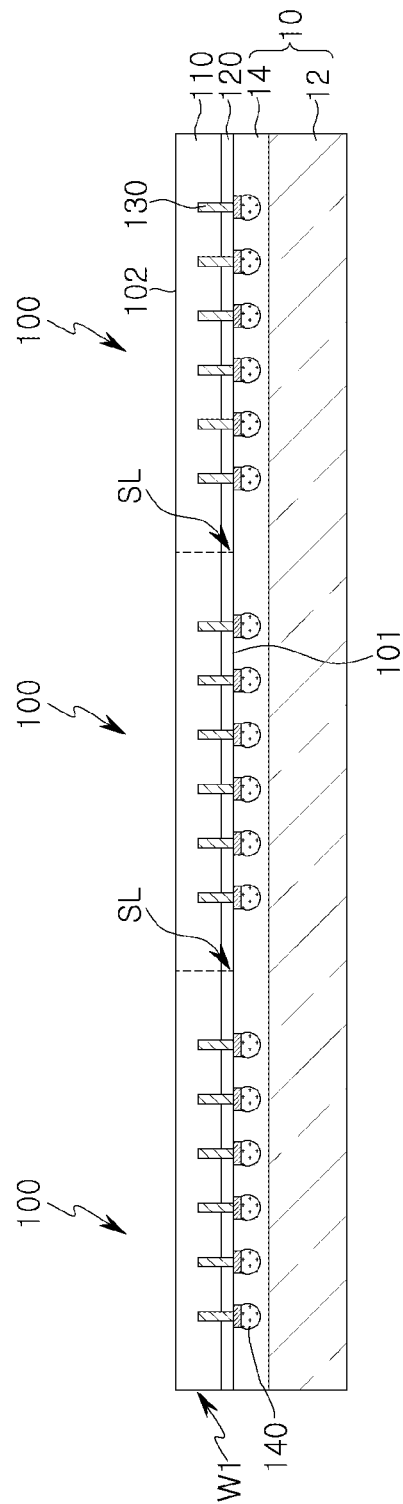

Referring to FIG. 12, the first semiconductor wafer W1 including the first connection bump 140 thereon may be attached to a first carrier substrate 10. The first carrier substrate 10 may include a first support substrate 12 and a first adhesive material layer 14. The first semiconductor wafer W1 may be attached to the first carrier substrate 10 such that the first connection bump 140 may face the first carrier substrate 10. The first connection bump 140 may be surrounded by the first adhesive material layer 14. A portion of the first lower surface 101 of the first semiconductor substrate 110 exposed by the first connection bump 140 may be in contact with the first adhesive material layer 14.

Figure 13:
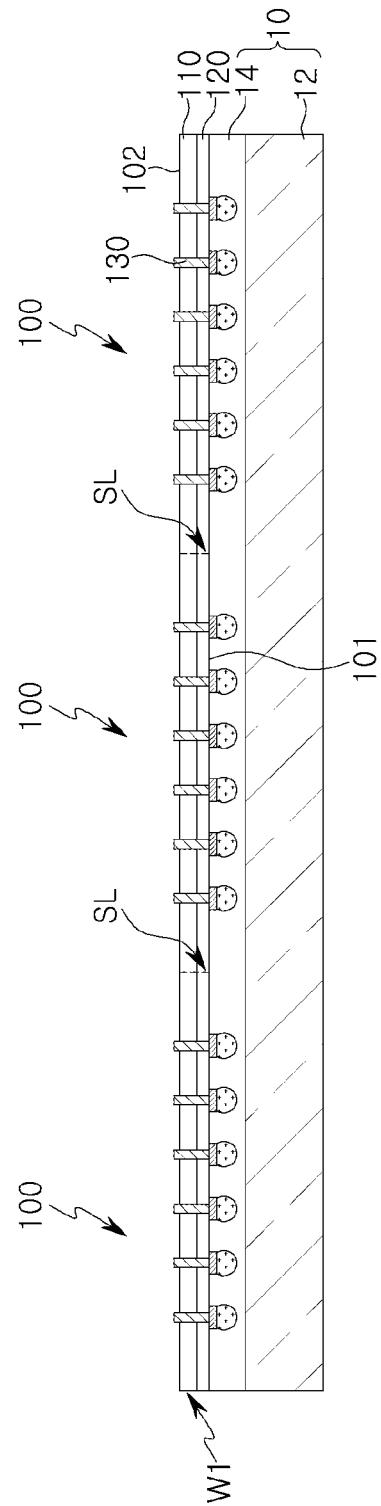

Referring to FIG. 13, the first through-electrode 130 may be exposed by removing a portion of the first semiconductor substrate 110. The first through-electrode 130 may be exposed on the first upper surface 102 of the first semiconductor substrate 110. As the first through-electrode 130 is exposed on the first upper surface 102 of the first semiconductor substrate 110, the first through-electrode 130 may penetrate the first semiconductor substrate 110. Selectively, a portion of the first semiconductor substrate 110 may be removed to allow the first through-electrode 130 to protrude further than the first upper surface 102. In some embodiments, the first through-electrode 130 may extend through the first semiconductor substrate 110 after removing the portion of the first semiconductor substrate 110 as illustrated in FIG. 13.

To expose the first through-electrode 130, a portion of the first semiconductor substrate 110 may be removed using, for example, a chemical mechanical polishing (CMP) process, an etch-back process, or a combination thereof.

Figure 14:
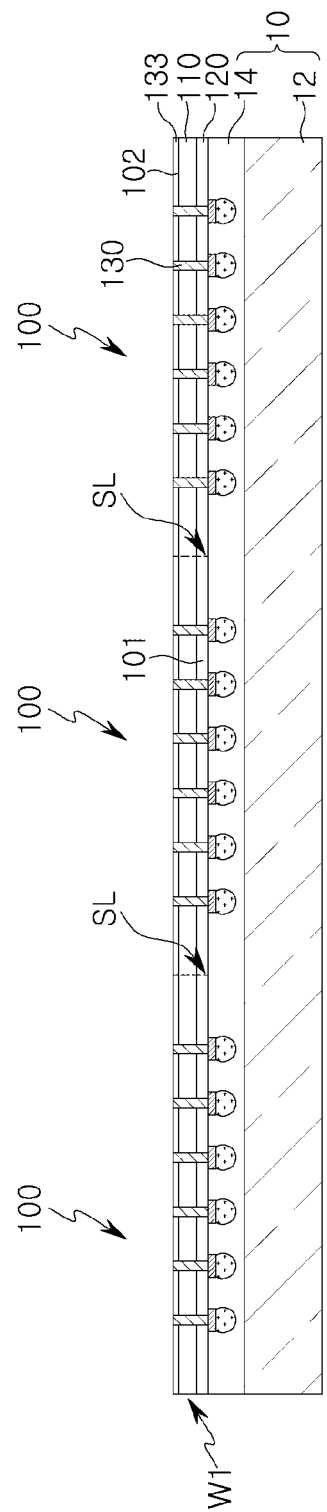

Referring to FIG. 14, a first rear surface protective layer 133 covering the exposed surface of the first semiconductor wafer W1 (i.e., the first upper surface 102 of the first semiconductor substrate 110) may be formed. The first rear surface protective layer 133 may be formed by, for example, a spin coating process or a spraying process. The first rear surface protective layer 133 may be formed of, for example, an insulating polymer. To form the first rear surface protective layer 133, an insulating polymer film covering the first upper surface 102 of the first semiconductor substrate 110 and the exposed first through-electrode 130 may be formed, and the insulating polymer film may be partially removed through, for example, an etch-pack process such that the first through-electrode 130 may be exposed.

Figure 15:
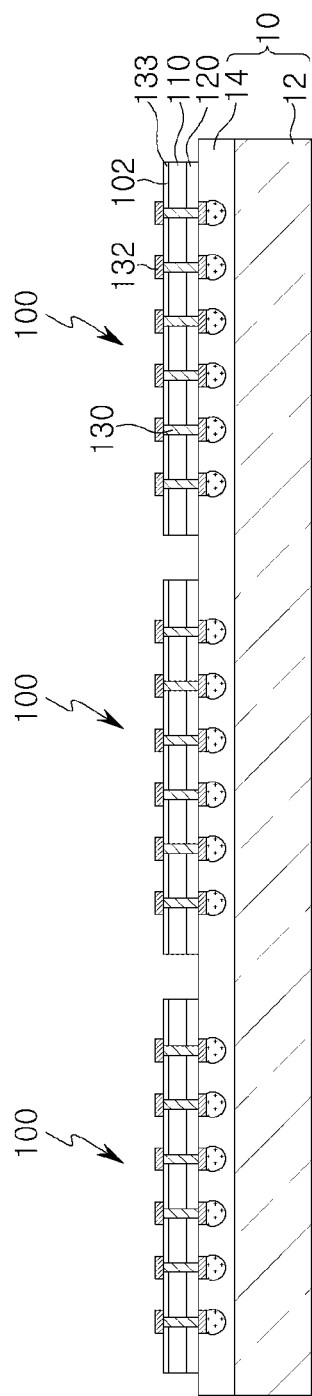

Referring to FIG. 15, a first upper connection pad 132 electrically connected to the portion of the first through-electrode 130 exposed by the first rear surface protective layer 133 may be formed. The first upper connection pad 132 may not be provided selectively. Also, the first semiconductor wafer W1 may be divided into the plurality of first semiconductor chips 100 by cutting the first semiconductor wafer W1 along the scribe lane SL (in FIG. 14) using, for example, a sawing blade (not illustrated). The plurality of divided first semiconductor chips 100 may be disposed side by side in a horizontal direction.

Figure 16:
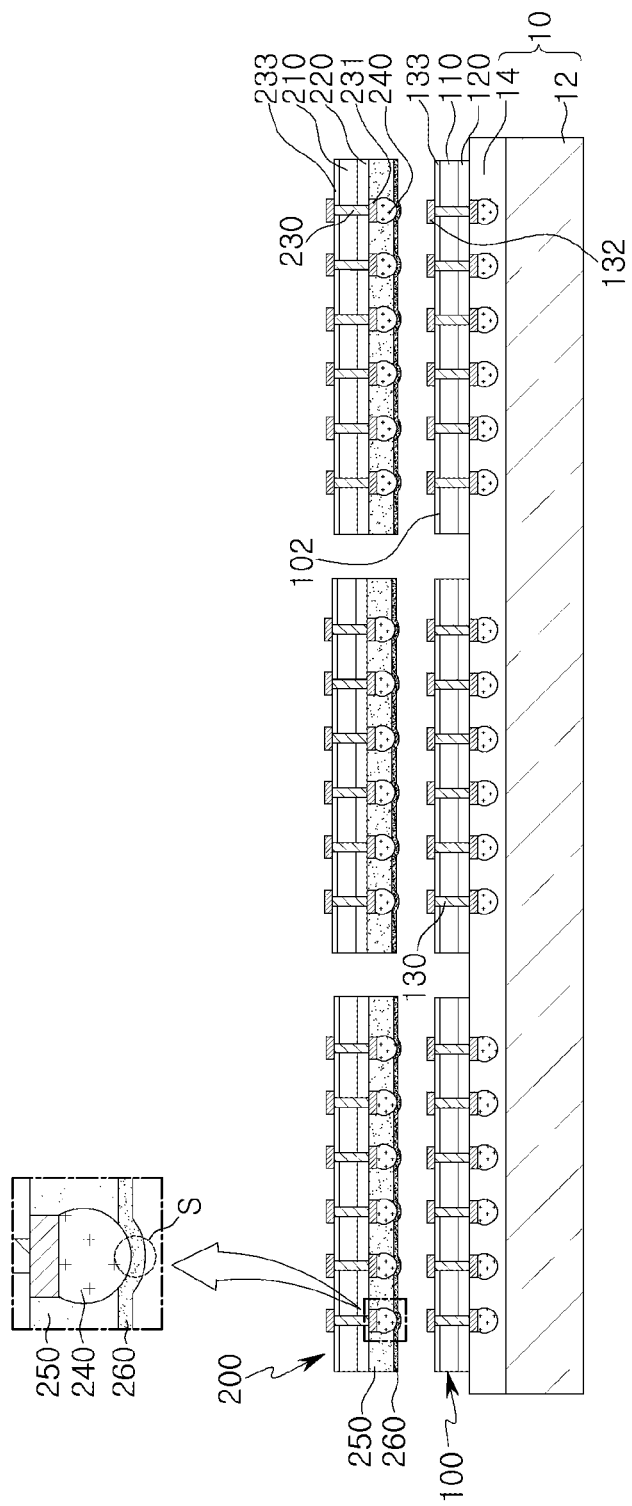

Referring to FIG. 16, second semiconductor chips 200 may be stacked on the first semiconductor chip 100. To prepare the second semiconductor chips 200, a second semiconductor wafer (not illustrated) may be processed by a method similar to the method of processing the first semiconductor wafer W1 illustrated in FIGS. 11 to 15, and the second semiconductor wafer may be divided, thereby preparing the second semiconductor chip 200.

The second semiconductor wafer may include the same type of individual devices formed through the process the same as or similar to the process of manufacturing the first semiconductor wafer W1. Accordingly, the second semiconductor chips 200 may be attached to a second carrier substrate in a form of the second semiconductor wafer in which the second semiconductor chips are connected to one another, and the second semiconductor wafer may be divided into the second semiconductor chips 200 by a cutting process. The second semiconductor chip 200 may include a second semiconductor substrate 210, a second semiconductor device layer 220, a second through-electrode 230, a second lower connection pad 231, and a second connection bump 240.

A first insulating layer 250 and a second insulating layer 260 may be disposed below the second semiconductor chips 200. The first insulating layer 250 may cover a side surface of the second lower connection pad 231 and a portion of a side surface of the second connection bump 240. A thickness of the first insulating layer 250 may be less than a sum of a height of the second lower connection pad 231 and a height of the second connection bump 240, and the first insulating layer 250 may expose at least a portion of the second connection bump 240. The second insulating layer 260 may be disposed below the first insulating layer 250, and may directly cover a portion of the second connection bump 240 exposed by the first insulating layer 250 (see the region "S" in FIG. 16). In some embodiments, the thickness of the first insulating layer 250 may be less than a sum of a thickness of the second lower connection pad 231 and a thickness of the second connection bump 240 as illustrated in FIG. 16.

The second insulating layer 260 may be configured as a flux, and may be interposed between the second connection bump 240 and the first upper connection pad 132. Accordingly, the first insulating layer 250 may be inhibited or possibly prevented from flowing into a region between the lower region S of the second connection bump 240 exposed by the first insulating layer 250 and the first upper connection pad 132 during subsequent processes (e.g., a reflow process). Thus, a contact defect such as a non-wet phenomenon, and a defect of shorts between adjacent solders, occurring in the reflow process, may be inhibited or possibly prevented.

Figure 17:
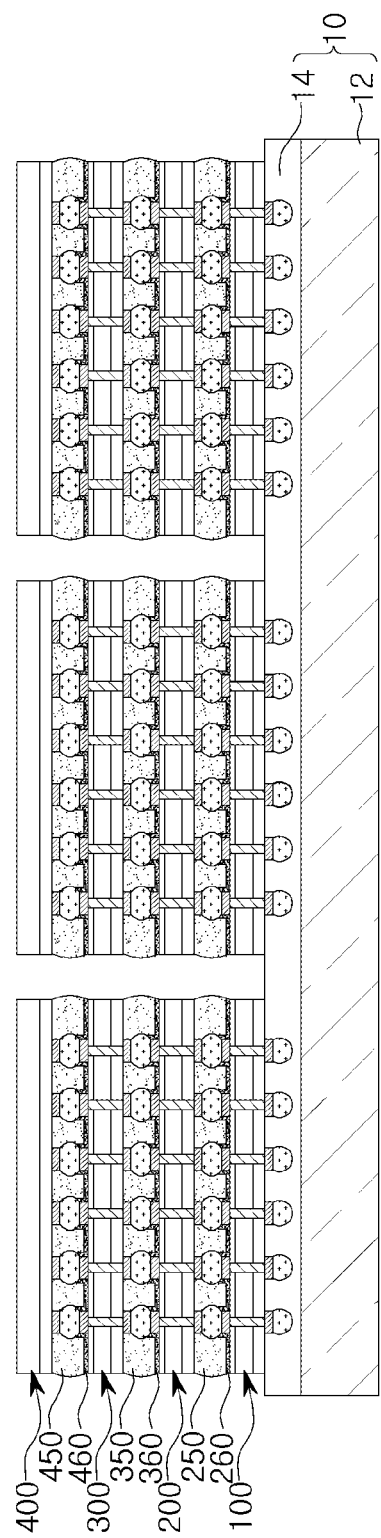

Referring to FIG. 17, the second semiconductor chip 200, the third semiconductor chip 300, and the fourth semiconductor chip 400 may be stacked in order on the first semiconductor chip 100. The third and fourth semiconductor chips 300 and 400 may be prepared by the method the same as or similar to the method of preparing the second semiconductor chips 200. The third and fourth semiconductor chips 300 and 400 may include first insulating layers 350 and 450 and second insulating layers 360 and 460 on lower surfaces thereof, respectively. After preparing the second to fourth semiconductor chips 200, 300, and 400, a reflow process may be performed on the second to fourth semiconductor chips 200, 300, and 400 simultaneously, or a reflow process may be performed on each of the second to fourth semiconductor chips 200, 300, and 400 in order.

After the first to fourth semiconductor chips 100, 200, 300, and 400 are stacked, a reflow process or a thermal compression process may be performed to attach second insulating layers 260, 360, and 460 to upper surfaces of the semiconductor chips, disposed below the insulating layers.

Figure 18:
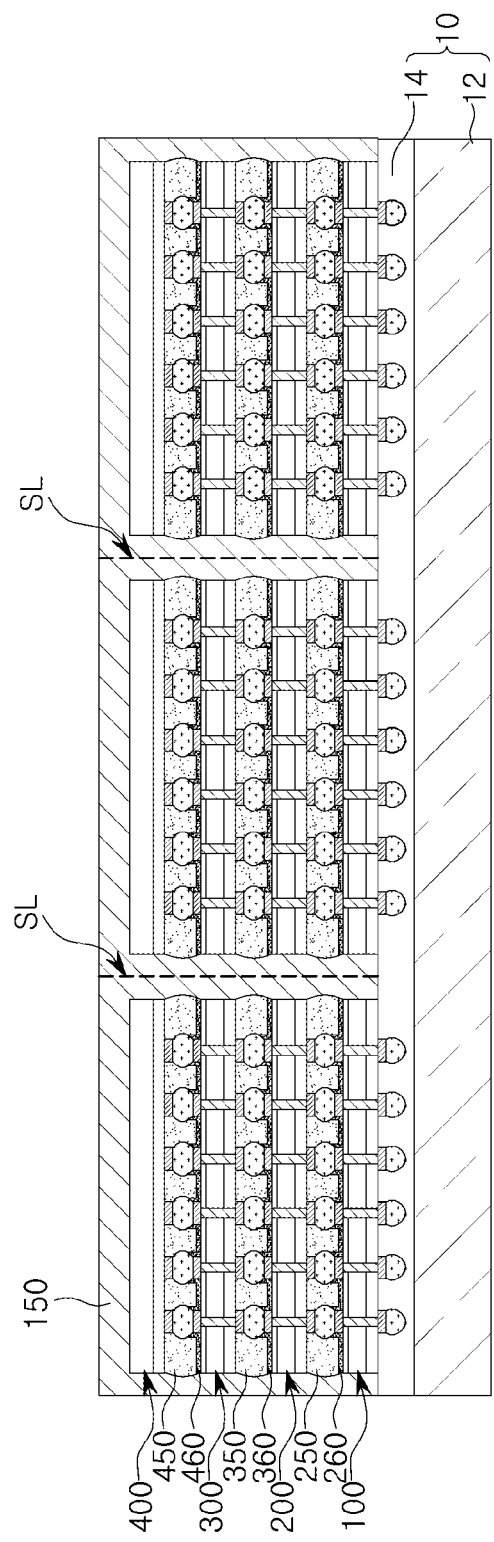

Referring to FIG. 18, a first molding member 150 covering the first to fourth semiconductor chips 100, 200, 300, and 400 may be disposed on the first carrier substrate 10. The first molding member 150 may cover side surfaces of the first to third semiconductor chips 100, 200, and 300 and a side surface and an upper surface of the fourth semiconductor chip 400. The first molding member 150 may cover side surfaces of the first and second insulating layers 250, 260, 350, 360, 450, and 460 disposed among the first to fourth semiconductor chips 100, 200, 300, and 400. The first molding member 150 may include an epoxy mold compound (EMC). Thereafter, by performing a cutting process along the scribe lane SL, semiconductor packages each including the first to fourth semiconductor chips 100, 200, 300, and 400 and corresponding to one another may be manufactured.

According to the aforementioned example embodiments, a semiconductor package having improved contact reliability between the stacked semiconductor chips may be provided.

While the example embodiments have been shown and described above, it will be apparent to those skilled in the art that modifications and variations could be made without departing from the scope of the present inventive concept as defined by the appended claims.

The above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor package comprising:
   a first semiconductor chip comprising a plurality of first through-electrodes and a plurality of first upper connection pads that are on an upper surface of the first semiconductor chip, wherein lower surfaces of the plurality of first upper connection pads contact the plurality of first through-electrodes, respectively;
   a second semiconductor chip on the first semiconductor chip and comprising a plurality of second lower connection pads on a lower surface of the second semiconductor chip, the lower surface of the second semiconductor chip facing the upper surface of the first semiconductor chip;
   a plurality of connection bumps that are between the first semiconductor chip and the second semiconductor chip, wherein each of the plurality of connection bumps is connected to a respective one of the plurality of first upper connection pads and a respective one of the plurality of second lower connection pads;

a first insulating film between the first semiconductor chip and the second semiconductor chip and comprising a first non-conductive film layer and a first flux layer between the first non-conductive film layer and the first semiconductor chip; and a first molding member on side surfaces of the first semiconductor chip, the second semiconductor chip, and the first insulating film, wherein the first flux layer comprises a first portion continuously extending on the upper surface of the first semiconductor chip to an edge of the first semiconductor chip, and one end of the first portion of the first flux layer is exposed by a side surface of the first non-conductive film layer, wherein the lower surfaces of the plurality of first upper connection pads are coplanar with a lower surface of the first portion of the first flux layer, and wherein the first portion of the first flux layer extends in a horizontal direction, and the first flux layer further comprises a second portion that protrudes from the first portion of the first flux layer in a vertical direction and contacts a side surface of a first one of the plurality of first upper connection pads, and wherein the second portion of the first flux layer has a uniform thickness along the side surface of the first one of the plurality of first upper connection pads.

2. The semiconductor package of claim 1,
wherein the plurality of connection bumps comprises a first connection bump,
wherein an upper surface of the first one of the plurality of first upper connection pads comprises a first portion contacting the first connection bump and a second portion not contacting the first connection bump,
wherein the first flux layer extends on the second portion of the upper surface of the first one of the plurality of first upper connection pads.

3. The semiconductor package of claim 1, further comprising:
a second lower passivation layer extending on the lower surface of the second semiconductor chip and a side surface and a portion of a lower surface of a first one of the plurality of second lower connection pads; and
a vertical structure on the first one of the plurality of second lower connection pads and the second lower passivation layer and connecting the first one of the plurality of second lower connection pads to a first one of the plurality of connection bumps.

4. The semiconductor package of claim 1, wherein a first one of the plurality of connection bumps is connected to the first one of the plurality of first upper connection pads and a first one of the plurality of second lower connection pads, and
a vertical axis crossing a center of the first one of the plurality of first upper connection pads is offset from a vertical axis crossing a center of the first one of the plurality of second lower connection pads.

5. The semiconductor package of claim 1, further comprising:
a first upper passivation layer on the upper surface of the first semiconductor chip,
wherein the lower surface of the first one of the plurality of first upper connection pads contacts a first one of the plurality of first through-electrodes, and a portion of the first one of the plurality of first through-electrodes is in the first upper passivation layer, and
wherein the first flux layer extends along an upper surface of the first upper passivation layer and the side surface of the first one of the plurality of first upper connection pads.

6. The semiconductor package of claim 1, further comprising:
a substrate, wherein the first semiconductor chip is mounted on an upper surface of the substrate; and
a second insulating film between the substrate and the first semiconductor chip and comprising a second non-conductive film layer in a space between the substrate and the first semiconductor chip and a second flux layer between the second non-conductive film layer and the substrate,
wherein the first molding member extends on a side surface of the second insulating film and the upper surface of the substrate.

7. The semiconductor package of claim 1, further comprising:
a substrate, wherein the first semiconductor chip is mounted on an upper surface of the substrate; and
a second molding member on the substrate and extending on a side surface of the first molding member.

8. The semiconductor package of claim 1, wherein the plurality of connection bumps comprise a first connection bump,
wherein a side surface of the first connection bump comprises an upper portion and a lower portion, and the first flux layer extends on the lower portion of the side surface of the first connection bump, and
in a cross-sectional view, the upper portion of the side surface of the first connection bump has a first length that is greater than a second length of the lower portion of the side surface of the first connection bump.

9. The semiconductor package of claim 1, wherein the plurality of connection bumps comprise a first connection bump,
wherein a side surface of the first connection bump comprises an upper portion and a lower portion, and the first flux layer extends on the lower portion of the side surface of the first connection bump, and
the first non-conductive film layer is in contact with the lower surface of the second semiconductor chip and the upper portion of the side surface of the first connection bump.

* * * * *